US012753502B2

(12) United States Patent
Suda et al.

(10) Patent No.: US 12,753,502 B2
(45) Date of Patent: Oct. 6, 2026

(54) SHOWER HEAD, ELECTRODE UNIT, GAS SUPPLY UNIT, SUBSTRATE PROCESSING APPARATUS, AND SUBSTRATE PROCESSING SYSTEM

(71) Applicant: TOKYO ELECTRON LIMITED, Tokyo (JP)

(72) Inventors: Ryutaro Suda, Miyagi (JP); Maju Tomura, Miyagi (JP); Susumu Nogami, Miyagi (JP); Hideaki Yakushiji, Miyagi (JP); Takahiro Murakami, Miyagi (JP); Yusuke Wako, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 749 days.

(21) Appl. No.: 17/830,877

(22) Filed: Jun. 2, 2022

(65) Prior Publication Data

US 2022/0389584 A1 Dec. 8, 2022

(30) Foreign Application Priority Data

Jun. 2, 2021 (JP) ................................ 2021-092921
May 16, 2022 (JP) ................................ 2022-080141

(51) Int. Cl.
*C23C 16/455* (2006.01)
*C23C 16/44* (2006.01)
*C23C 16/52* (2006.01)

(52) U.S. Cl.
CPC .... *C23C 16/45565* (2013.01); *C23C 16/4404* (2013.01); *C23C 16/4558* (2013.01); *C23C 16/52* (2013.01)

(58) Field of Classification Search
CPC .......... C23C 16/45565; C23C 16/4404; C23C 16/4558; C23C 16/52; H01J 37/32532; H01J 37/3244; H01J 37/32477; H01J 37/32467; H01J 37/32495; H01J 37/3255; H01J 37/32559; H01L 21/67069; H01L 21/31116; H01L 21/32137
USPC ........................ 118/715; 156/345.33, 345.34
See application file for complete search history.

(56) References Cited

U.S. PATENT DOCUMENTS 6,890,861 B1 * 5/2005 Bosch ................ C04B 41/0054 427/535
10,811,232 B2 * 10/2020 Srikantaiah ............. B05B 1/005
11,164,726 B2 * 11/2021 Matsumoto ....... H01J 37/32091
2003/0181065 A1 * 9/2003 O'Donnell .......... C23C 16/4404 438/785
2014/0116338 A1 * 5/2014 He .......................... C23C 14/06 118/723 R (Continued)

FOREIGN PATENT DOCUMENTS

CN 110391141 A 10/2019
JP 2004-292887 A 10/2004

(Continued)

*Primary Examiner* — Rudy Zervigon
(74) *Attorney, Agent, or Firm* — XSENSUS LLP

(57) ABSTRACT

A shower head for plasma processing includes a body part having a first surface, a second surface opposite to the first surface, and a plurality of inner side surfaces. The plurality of inner side surfaces is configured to define a plurality of gas holes penetrating through the body part from the first surface to the second surface. The second surface is made of a first corrosion-resistant material.

5 Claims, 8 Drawing Sheets

(56) References Cited

U.S. PATENT DOCUMENTS

| | | | | |
|---|---|---|---|---|
| 2014/0117120 | A1* | 5/2014 | He | C23C 14/32 239/548 |
| 2015/0147482 | A1* | 5/2015 | Kang | C23C 16/4404 427/535 |
| 2016/0090650 | A1* | 3/2016 | Qian | C23C 16/4404 427/9 |
| 2018/0330923 | A1* | 11/2018 | Tran | C23C 16/04 |
| 2019/0218663 | A1* | 7/2019 | Funakubo | C23C 16/4404 |
| 2020/0291528 | A1 | 9/2020 | He et al. | |
| 2023/0038880 | A1* | 2/2023 | Ganany | H01J 37/32935 |

FOREIGN PATENT DOCUMENTS

| | | | |
|---|---|---|---|
| JP | 2008081815 | A | 4/2008 |
| JP | 3178150 | U | 9/2012 |
| JP | 2016-208034 | A | 12/2016 |
| JP | 2019-033249 | A | 2/2019 |
| JP | 2020-088317 | A | 6/2020 |
| KR | 10-20080029839 | A | 4/2008 |
| KR | 10-2008-0079584 | A | 9/2008 |
| KR | 10-20150054655 | A | 5/2015 |
| KR | 10-20190123233 | A | 10/2019 |
| KR | 10-2020-0066217 | A | 6/2020 |
| KR | 10-2020-0131432 | A | 11/2020 |
| TW | 201842532 | A | 12/2018 |

* cited by examiner

SHOWER HEAD, ELECTRODE UNIT, GAS SUPPLY UNIT, SUBSTRATE PROCESSING APPARATUS, AND SUBSTRATE PROCESSING SYSTEM

CROSS-REFERENCE TO RELATED APPLICATIONS

This application claims priority to Japanese Patent Application No. 2021-092921, filed Jun. 2, 2021 and Japanese Patent Application No. 2022-080141, filed May 16, 2022, respectively, the entire contents of which are incorporated herein by reference.

TECHNICAL FIELD

Exemplary embodiments of the present disclosure relate to a shower head, an electrode unit, a gas supply unit, a substrate processing apparatus, and a substrate processing system.

BACKGROUND

For example, Japanese Laid-open Patent Publication No. 2016-208034 discloses a technique for coating an inside of a chamber for processing plasma.

SUMMARY

The present disclosure provides a technique for increasing corrosion resistance to a process gas.

One aspect of the present disclosure provides a shower head for plasma processing including a body part having a first surface, a second surface opposite to the first surface, and a plurality of inner side surfaces, the plurality of inner side surfaces configured to define a plurality of gas holes penetrating through the body part from the first surface to the second surface, wherein the second surface is made of a first corrosion-resistant material.

DETAILED DESCRIPTION

Figure 1A:
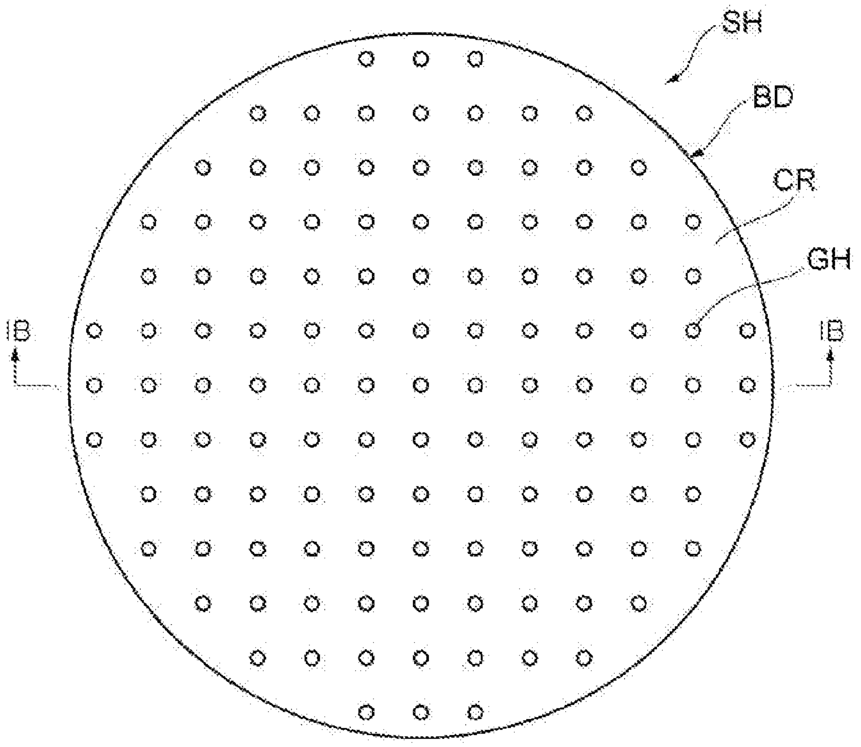
FIG. 1A is a plan view of a shower head SH.

Hereinafter, each embodiment of the present disclosure will be described.

One exemplary embodiment provides a shower head for plasma processing including a body part having a first surface, a second surface opposite to the first surface, and a plurality of inner side surfaces. The plurality of inner side surfaces configured to define a plurality of gas holes penetrating through the body part from the first surface to the second surface. The second surface is made of a first corrosion-resistant material.

According to one exemplary embodiment, the first corrosion-resistant material is a material having a higher corrosion resistance to gas including at least one selected from a group consisting of $F_2$, $XeF_2$, $WF_6$, $MoF_6$, $IF_7$, HF, and $ClF_3$ than a material constituting the body part.

According to one exemplary embodiment, the first corrosion-resistant material is a material having a higher corrosion resistance to hydrogen fluoride gas than a material constituting the body part.

According to one exemplary embodiment, a film made of the first corrosion-resistant material is formed on the second surface.

According to one exemplary embodiment, the film is further provided on the plurality of inner side surfaces.

According to one exemplary embodiment, the film is not formed on the first surface.

According to one exemplary embodiment, the body part is made of the first corrosion-resistant material.

According to one exemplary embodiment, the first corrosion-resistant material is a carbon-containing material or a metal-containing material.

According to one exemplary embodiment, the first corrosion-resistant material includes at least one selected from a group consisting of a fluorocarbon resin, carbon, fluorinated carbon, a polyimide resin, and silicon carbide.

According to one exemplary embodiment, the first corrosion-resistant material includes at least one selected from a group consisting of metal, metal nitride, metal carbide, metal oxide, and an alloy.

According to one exemplary embodiment, the body part is made of a silicon-containing material.

According to one exemplary embodiment, the silicon-containing material is a conductive silicon-containing material.

According to one exemplary embodiment, the silicon-containing material is silicon oxide.

According to one exemplary embodiment, the body part includes a base material containing carbon and a silicon carbide film configured to cover a surface of the base material.

According to one exemplary embodiment, the body part has a substantially disk shape, the first surface constitutes one surface of the disk, and the second surface constitutes the other surface of the disk.

One exemplary embodiment provides an electrode unit including the shower head and a conductive support body disposed on a second surface side of the shower head and having a gas supply path for supplying a process gas to the plurality of gas holes of the shower head.

According to one exemplary embodiment, a third surface of the support body opposite to the second surface of the shower head is made of a second corrosion-resistant material.

According to one exemplary embodiment, the second corrosion-resistant material is a semi-sealing-treated anodized film.

One exemplary embodiment provides a gas supply unit for plasma processing including an annular body part, a plurality of gas holes provided on a radially inner side of the body part and provided along a circumferential direction of the body part, and a gas supply path provided inside of the body part and communicating with the plurality of gas holes. At least an inner peripheral surface of the gas supply path is made of a first corrosion-resistant material.

One exemplary embodiment provides a substrate processing apparatus including a chamber for plasma processing, a substrate support provided in the chamber, an electrode unit which is disposed on an upper portion of the chamber so that the first surface of the shower head faces the substrate support, a plasma generation unit, and a control unit.

One exemplary embodiment provides a substrate processing apparatus including a chamber for plasma processing, a substrate support provided in the chamber, a gas supply unit installed along an inner wall of the chamber, a plasma generation unit, and a control unit.

According to one exemplary embodiment, the chamber is connected to a gas source group for supplying a process gas containing a hydrogen fluoride gas, and the controller is configured to execute: a process of controlling a temperature of a third surface of the support body to 220° C. or less, the third surface of the support body opposite to the second surface of the shower head, a process of disposing a substrate having a silicon-containing film on the substrate support, a process of supplying the process gas from the gas source group into the chamber, and a process of generating plasma from the process gas by the plasma generation unit and etching the silicon-containing film.

One exemplary embodiment provides a substrate processing system including a substrate processing apparatus, a gas source group, and a gas supply pipe for supplying a process gas from the gas source group to the substrate processing apparatus. At least an inner peripheral surface of the gas supply pipe is made of a third corrosion-resistant material.

Hereinafter, each embodiment of the present disclosure will be described in detail with reference to the drawings. In addition, in each drawing, similar or identical elements are denoted by the same number, and an overlapping description thereof will be omitted. Unless otherwise specified, positional relationships such as up, down, left, and right will be described based on a positional relationship illustrated in the drawings. Dimensional ratios in the drawings do not represent actual ratios, and the actual ratios are not limited to the illustrated ratios.

<Configuration of Shower Head SH>

Figure 1B:
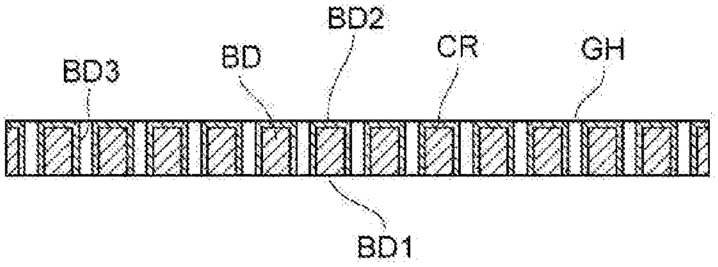
FIG. 1B is a cross-sectional view taken along line IB-IB of FIG. 1A.

FIG. 1A is a plan view of a shower head SH according to one exemplary embodiment. FIG. 1B is a cross-sectional view of the shower head SH taken along line IB-IB of FIG. 1A. The shower head SH is a shower head for plasma processing. The shower head SH is, for example, installed in a chamber (hereinafter, simply referred to as a "chamber") configured to generate plasma, and may be used as a member for supplying a process gas for plasma generation to an internal space of the chamber.

The shower head SH has a body BD having a substantially disk shape. The body BD has a first surface BD1 that constitutes one surface of the disk, a second surface BD2 that constitutes the other surface of the disk and is an opposite side of the first surface BD1, and a plurality of inner side surfaces BD3. The plurality of inner side surfaces BD3 are surfaces continuous to the first surface BD1 and the second surface BD2. The plurality of inner side surfaces BD3 define a plurality of gas holes (through holes) GH penetrating through the body BD from the first surface BD1 to the second surface BD2. When the shower head SH is installed in the chamber, the first surface BD1 may be a portion that faces the internal space of the chamber and is exposed to plasma generated in the chamber. When the shower head SH is installed in the chamber, the second surface BD2 may be a portion that does not face the internal space of the chamber and is not exposed to plasma generated in the chamber. All or part of the plurality of inner side surfaces BD3 may be portions not exposed to plasma when the shower head SH is installed in the chamber. A part of the inner side surface BD3, for example, the vicinity of the first surface BD1, may be a portion exposed to plasma. When installed in the chamber, the plurality of gas holes GH may constitute a part of a flow path for supplying the process gas to the chamber.

The body BD may have any shape. For example, the first surface or the second surface may not be a flat surface, and may be, for example, a curved surface or may have irregularities. The first surface and the second surface may not be circular in plan view, and may have any shape (for example, circle, oval, rectangle, and the like). The first surface and the second surface may have the same or similar shape to each other, or may be different from each other. In addition, each of the plurality of gas holes GHs may have any shape (for example, circle, oval, rectangle, and the like). The plurality of gas holes GHs may have any arrangement (arrangement at an even distance, arrangement so that a specific range is dense, arrangement in a spiral from a center, and the like).

The body BD may be made of, for example, a silicon-containing material. The silicon-containing material may be, for example, a conductive material such as silicon or silicon carbide, or an insulating material such as silicon oxide (for example, quartz). Further, the body BD may be formed of a carbon-containing base material (core material) and a silicon carbide film covering a surface of the base material (core material).

The second surface BD2 of the body BD is made of a first corrosion-resistant material. In one example, a film CR made of the first corrosion-resistant material is formed on the second surface BD2 of the body BD. The film CR may also be formed on the plurality of inner side surfaces BD3. A thickness of the film CR is, for example, 10 nm to 100 μm. Further, the film CR may or may not be formed on the first surface BD1 of the body BD.

The first corrosion-resistant material constituting the film CR may have high corrosion resistance to a process gas that may flow through the gas hole BH. An example of such a process gas may include a gas having high corrosiveness in a stage (for example, in a stage of room temperature pressure control) before being plasmolyzed in the chamber, for example, a fluorine-containing gas such as $F_2$, $CF_4$, $SF_6$, $NF_3$, $XeE_2$, $WF_6$, $SiF_4$, $TaF_5$, $IF_7$, HF, $ClF_3$, $ClF_5$, $BrF_5$, $AsF_5$, $NF_5$, $PF_5$, $NbF_5$, $BiF_5$, and $UF_5$, and the like. Among these, the fluorine-containing gas may be at least one gas selected from the group consisting of $F_2$, $XeF_2$, $WF_6$, $MoF_6$, $IF_7$, HF, and $ClF_3$, and may be, for example, a hydrogen fluoride (HF) gas. The first corrosion-resistant material constituting the film CR may have the corrosion resistance higher than that of the material constituting the body BD.

The first corrosion-resistant material may be, for example, a carbon-containing material or a metal-containing material. The carbon-containing material may be, for example, at least one selected from a group consisting of carbon (for example, amorphous carbon, diamond, diamond-like carbon, or graphite), fluorinated carbon, a fluorocarbon resin (for example, polytetrafluoroethylene), a polyimide resin, and silicon carbide, and, for example, may be the polyimide resin or the silicon carbide. The metal-containing material may be metal (for example, platinum, gold, or tungsten), metal nitride (for example, iron nitride), metal carbide (for example, tungsten carbide), metal oxide (for example, chromium oxide, yttrium oxide, or alumina), or an alloy (for example, hastelloy).

A method for forming a film CR is not particularly limited. For example, the film CR may be formed by depositing the first corrosion-resistant material on a base material of the body BD at the second surface BD2 side and the plurality of inner side surfaces BD3 of the body BD using the CVD method. In addition, by forming the film CR on the base material of the body BD at the first surface BD1 side, and then removing the film CR on the first surface BD1, the film CR may remain only on the second surface BD2 and the inner side surface BD3 of the body BD. The film CR of the first surface BD may be removed by, for example, installing the shower head SH in the chamber and then exposing the first surface BD to the plasma generated in the chamber. In addition, the film CR may be formed to be passivated by nitriding or carbonizing the material (for example, silicon when the body BD is a silicon-containing material) constituting the body BD. That is, the film CR may be a passivation film.

In one example, in addition to or instead of forming the film CR, the material constituting the body BD may be made of the above-described first corrosion-resistant material. In this case, even if the film CR is not formed, the surface of the body BD including the second surface BD2 is made of the first corrosion-resistant material.

Figure 2A:
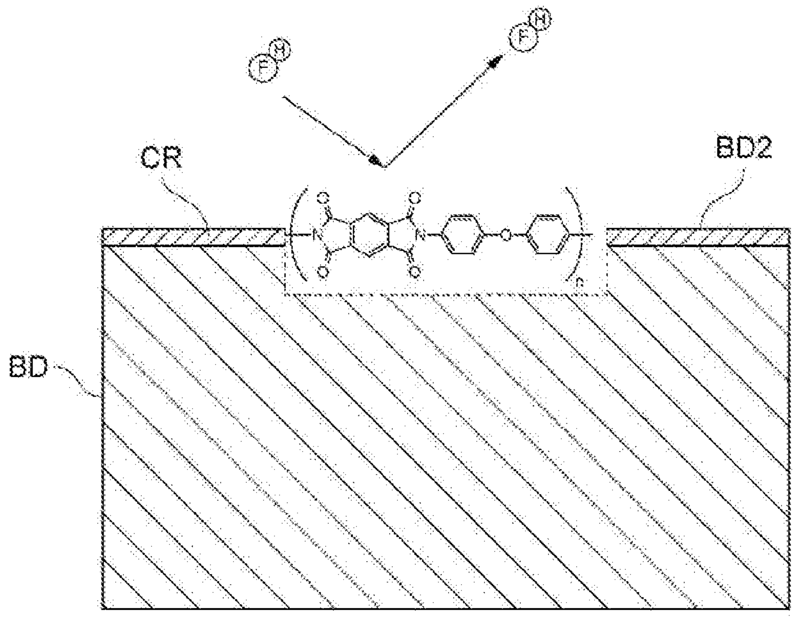
FIG. 2A is a conceptual diagram for describing an effect of corrosion resistance when a polyimide film is formed as a film CR.
Figure 2B:
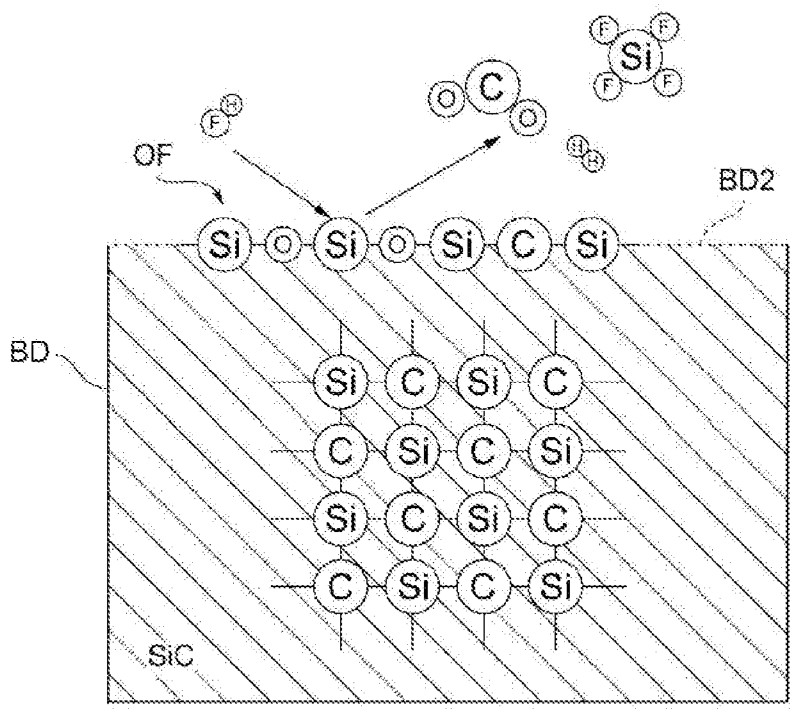
FIG. 2B is a conceptual diagram for describing the effect of corrosion resistance when a body BD is made of silicon carbide.

FIGS. 2A and 2B are diagrams for describing the effect of the first corrosion-resistant material. When the body BD is made of silicon (single crystal silicon), a natural oxide film is present on the second surface BD2. For this reason, when the second surface BD2 is exposed to a fluorine-containing gas such as hydrogen fluoride, Si—O bonds constituting the natural oxide film are broken, and corrosion proceeds. FIG. 2A shows an example in which the polyimide film as the film CR is formed on the second surface BD2 of the body BD. The polyimide film has a conjugated structure and high intermolecular force of an imide bond. For this reason, the corrosion resistance to the fluorine-containing gas is high, and the corrosion of the second surface BD2 may be suppressed. In addition, FIG. 2B illustrates an example in which the body BD is made of silicon carbide (SiC). In this case, the natural oxide film OF is present on the second surface BD2. For this reason, when the second surface BD2 is exposed to the fluorine-containing gas such as hydrogen fluoride, the Si—O bonds constituting the natural oxide film OF are broken. However, the body BD includes carbon atoms, so the Si—O bond may be limitedly broken, and the corrosion of the second surface BD2 may be suppressed.

Configuration of Substrate Processing Apparatus 1

Figure 3:
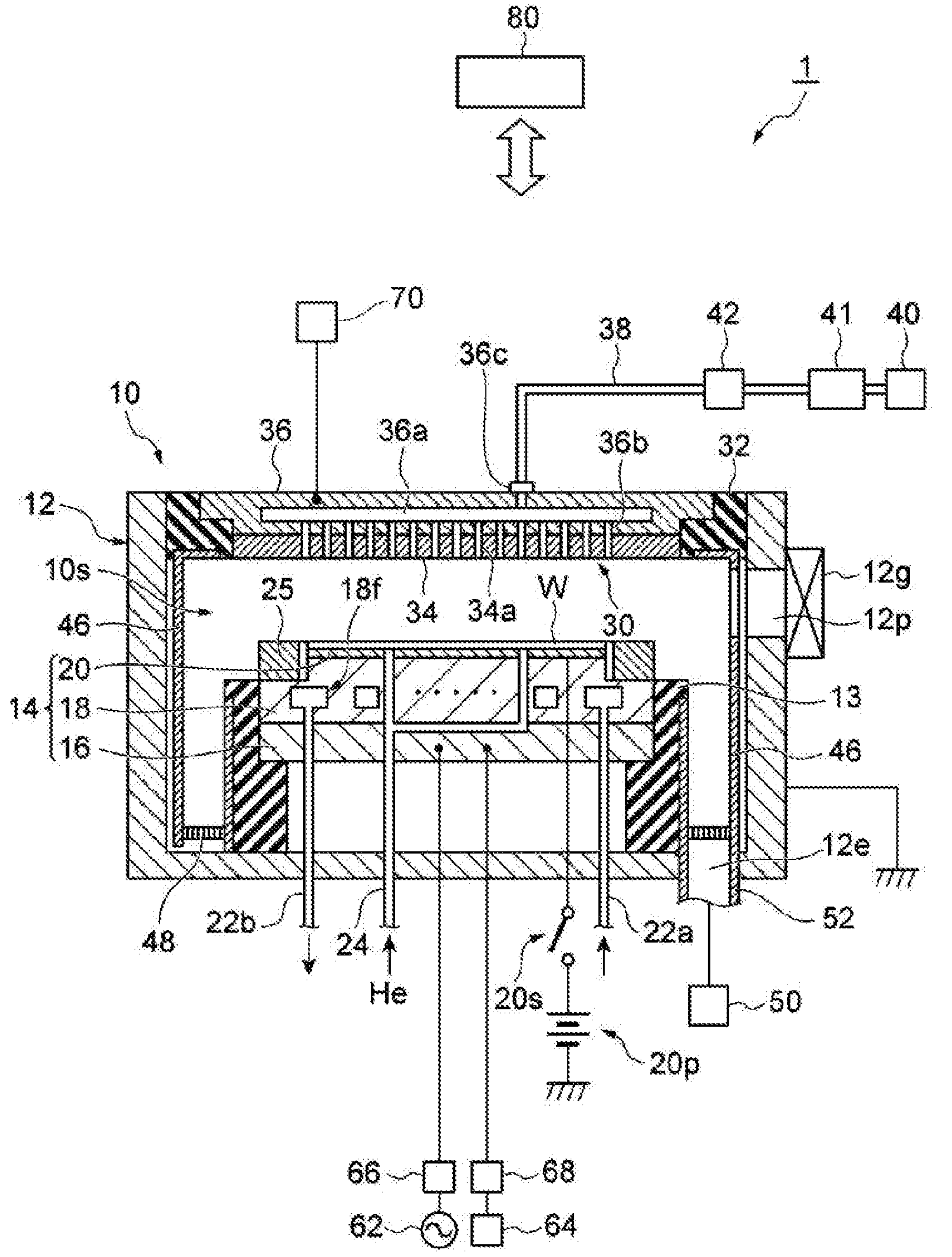
FIG. 3 is a diagram schematically illustrating a substrate processing apparatus 1.

FIG. 3 is a diagram schematically illustrating a substrate processing apparatus 1 according to one exemplary embodiment. The shower head SH illustrated in FIGS. 1A and 1B may be installed in the substrate processing apparatus 1. The substrate processing apparatus 1 to be described below is an example in which the shower head SH is used as an upper plate 34 of an upper electrode 30.

The substrate processing apparatus 1 illustrated in FIG. 3 includes a chamber 10. The chamber 10 has an internal space 10*s* provided therein. The chamber 10 includes a chamber body 12. The chamber body 12 has a substantially cylindrical shape. The chamber body 12 is made of, for example, aluminum. A film having corrosion resistance is provided on an inner wall surface of the chamber body 12. The film having the corrosion resistance may be made of ceramic such as aluminum oxide, yttrium oxide, or the like.

A passage 12*p* is formed on a sidewall of the chamber body 12. A substrate W is conveyed between the internal space 10*s* and an outside of the chamber 10 through the passage 12*p*. The passage 12*p* is opened and closed by a gate valve 12*g*. The gate valve 12*g* is provided along the sidewall of the chamber body 12.

A support 13 is provided on a bottom of the chamber body 12. The support 13 is made of an insulating material. The support 13 has a substantially cylindrical shape. The support 13 extends upwardly from the bottom of the chamber body 12 in the internal space 10*s*. The support 13 supports a substrate support 14. The substrate support 14 is configured to support the substrate W in the internal space 10*s*.

The substrate support 14 has a lower electrode 18 and an electrostatic chuck 20. The substrate support 14 may further include an electrode plate 16. The electrode plate 16 is formed of a conductors such as aluminum, and has a substantially disk shape. The lower electrode 18 is provided on the electrode plate 16. The lower electrode 18 is formed of a conductor such as aluminum and has a substantially disk shape. The lower electrode 18 is electrically connected to the electrode plate 16.

The electrostatic chuck 20 is provided on the lower electrode 18. The substrate W is mounted on an upper surface of the electrostatic chuck 20. The electrostatic chuck 20 has a body and an electrode. The body of the electrostatic chuck 20 has a substantially disk shape and is formed of a dielectric material. The electrode of the electrostatic chuck 20 is a film-shaped electrode, and is provided in the body of the electrostatic chuck 20. The electrode of the electrostatic chuck 20 is connected to a DC power supply 20*p* via a switch 20*s*. When a voltage from the DC power supply 20*p* is applied to the electrode of the electrostatic chuck 20, an electrostatic attraction force is generated between the electrostatic chuck 20 and the substrate W. The substrate W is attracted to the electrostatic chuck 20 by the electrostatic attraction force and is held by the electrostatic chuck 20.

An edge ring 25 is disposed on the substrate support 14. The edge ring 25 is a ring-shaped member. The edge ring 25 may be made of silicon, silicon carbide, quartz, or the like. The substrate W is disposed on the electrostatic chuck 20 and in an area surrounded by the edge ring 25.

A flow path 18*f* is provided inside the lower electrode 18. A heat exchange medium (for example, refrigerant) is supplied to the flow path 18*f* from a chiller unit provided outside the chamber 10 through a pipe 22*a*. The heat exchange medium supplied to the flow path 18*f* returns to the chiller unit through the pipe 22*b*. In the substrate processing apparatus 1, a temperature of the substrate W mounted on the electrostatic chuck 20 is adjusted by heat exchange between the heat exchange medium and the lower electrode 18.

A gas supply line 24 is provided in the substrate processing apparatus 1. The gas supply line 24 supplies a heat transfer gas (for example, He gas) from a heat transfer gas supply mechanism to a gap between an upper surface of the electrostatic chuck 20 and a back surface of the substrate W.

The substrate processing apparatus 1 further includes the upper electrode 30. The upper electrode 30 is provided above the substrate support 14. The upper electrode 30 is supported on the upper portion of the chamber body 12 via the member 32. The member 32 is made of an insulating material. The upper electrode 30 and the member 32 close an upper opening of the chamber body 12.

The upper electrode 30 may include an upper plate 34 (shower head SH) and a support body 36. The upper plate 34 (shower head SH) and the support body 36 constitute, for example, an electrode unit. The lower surface (first surface BD1) of the upper plate 34 (shower head SH) is a surface of the internal space 10*s* side, and defines the internal space 10*s*. The upper surface (second surface BD2) of the upper plate 34 (shower head SH) is a surface that does not face the internal space 10*s* (that is, that is not exposed to plasma). The corrosion-resistant film CR (see FIG. 1) is formed on the upper surface (second surface BD2) of the upper plate 34 (shower head SH). The substrate of the upper plate 34 (shower head SH) may be made of, for example, a conductive material such as silicon or silicon carbide, or an insulating material such as silicon oxide (for example, quartz). The upper plate 34 (shower head SH) has a plurality of gas discharge holes 34*a* (gas holes GHs) penetrating through the upper plate 34 (shower head SH) in a thickness direction thereof. The corrosion-resistant film CR (see FIG. 1) is formed on the inner side surface (inner side surface BD3) of the upper plate 34 defining the gas discharge hole 34*a* (gas hole GH).

The support body 36 is disposed on the upper surface (second surface) of the upper plate 34 (shower head SH) so as to face the upper plate 34. a peripheral portion of the upper plate 34 (shower head SH) is detachably supported by the support body 36 by fastening the peripheral portion of the upper plate 34 (shower head SH) with, for example, a bolt, by inserting the peripheral portion of the upper plate 34 between clamp members, or the like. In one example, the electrostatic chuck may be provided on the lower surface (the surface facing the upper plate 34) of the support body 36, and the upper surface of the upper plate 34 may be sucked and held by the electrostatic chuck. The electrostatic chuck may be configured so that an electrode plate made of a conductive film is inserted between a pair of dielectric films, and electrostatic force is generated by a voltage applied to the electrode plate. The support body 36 is made of, for example, a conductive material such as anodized aluminum or an aluminum alloy. A gas diffusion chamber 36*a* is provided inside the support body 36. The support body 36 has a plurality of gas holes 36*b* extending downward from the gas diffusion chamber 36*a*. The plurality of gas holes 36*b* communicate with the plurality of gas discharge holes 34*a*, respectively. A gas introduction port 36*c* is formed in the support body 36. The gas inlet 36*c* is connected to the gas diffusion chamber 36*a*. A gas supply pipe 38 provided outside the substrate processing apparatus 1 is connected to the gas inlet 36*c*. The gas diffusion chamber 36*a*, the plurality of gas holes 36*b*, and the gas inlet 36*c* constitute, for example, a gas supply path.

A gas source group 40 is connected to the gas supply pipe 38 via a flow rate controller group 41 and a valve group 42. In addition, similarly to the gas supply pipe 38, the flow rate controller group 41, the valve group 42, and the gas source group 40 are provided outside the substrate processing apparatus 1. The gas source group 40 includes a plurality of gas sources. The plurality of gas sources include a source of process gas. The flow rate controller group 41 includes a plurality of flow rate controllers. Each of the plurality of flow rate controllers in the flow rate controller group 41 is a mass flow controller or a pressure control type flow rate controller. The valve group 42 includes a plurality of opening/closing valves. Each of the plurality of gas sources of the gas source group 40 is connected to the gas supply pipe 38 via a corresponding flow rate controller of the flow rate controller group 41 and a corresponding opening/closing valve of the valve group 42. The gas supply pipe 38, the flow rate controller group 41, the valve group 42, and the gas source group 40 constitute a substrate processing system together with the substrate processing apparatus 1.

In the substrate processing apparatus 1, the shield 46 is provided to be freely detached along the inner wall surface of the chamber body 12 and an outer periphery of the support 13. The shield 46 prevents reaction by-products from adhering to the chamber body 12. The shield 46 is constituted by, for example, forming a film having corrosion resistance on a surface of a substrate made of aluminum. The film having the corrosion resistance may be made of ceramic such as yttrium oxide, and the like.

A baffle plate 48 is provided between the support 13 and the side wall of the chamber body 12. The baffle plate 48 is constituted by, for example, forming a film (such as a film of yttrium oxide) having corrosion resistance on a surface of a member made of aluminum. The plurality of through holes are formed in the baffle plate 48. An exhaust port 12*e* is provided below the baffle plate 48 and at the bottom of the chamber body 12. An exhaust device 50 is connected to the exhaust port 12*e* via an exhaust pipe 52. The exhaust device 50 includes a pressure regulating valve and a vacuum pump such as a turbo molecular pump.

The substrate processing apparatus 1 includes a high-frequency power supply 62 and a bias power supply 64. The high-frequency power supply 62 is a power supply that generates high-frequency power HF. The high-frequency power HF has a first frequency suitable for plasma generation. The first frequency is, for example, a frequency within a range of 27 MHz to 100 MHz. The high-frequency power supply 62 is connected to the lower electrode 18 via a matching device 66 and an electrode plate 16. The matching device 66 has a circuit for matching an impedance of a load side (lower electrode 18 side) of the high-frequency power supply 62 to an output impedance of the high-frequency power supply 62. In addition, the high-frequency power supply 62 may be connected to the upper electrode 30 via the matching device 66. The high-frequency power supply 62 constitutes, for example, a plasma generation unit.

The bias power supply 64 is a power supply for generating an electric bias. The bias power supply 64 is electrically connected to the lower electrode 18. The electrical bias has a second frequency. The second frequency is lower than the first frequency. The second frequency is, for example, a frequency within the range of 400 kHz to 13.56 MHz. The electrical bias is applied to the substrate support 14 to attract ions to the substrate W, when used together with the high-frequency power HF. In one example, the electrical bias is applied to the lower electrode 18. When the electrical bias is applied to the lower electrode 18, a potential of the substrate W mounted on the substrate support 14 fluctuates within a cycle defined by the second frequency. Further, the electric bias may be applied to a bias electrode provided in the electrostatic chuck 20.

When plasma processing is performed in the substrate processing apparatus 1, a gas is supplied to the internal space 10*s*. In addition, a high-frequency electric field is generated between the upper electrode 30 and the lower electrode 18 by supplying the high-frequency electric power HF and/or the electric bias. The generated high-frequency electric field generates plasma from the gas in the internal space 10*s*.

The substrate processing apparatus 1 further includes a power supply 70. The power supply 70 is connected to the upper electrode 30. In one example, the power supply 70 may be configured to supply a DC voltage or low-frequency power to the upper electrode 30 during the plasma processing. For example, the power supply 70 may supply a negative polarity DC voltage to the upper electrode 30, or may periodically supply low-frequency power. The DC voltage or low-frequency power may be supplied as a pulse wave or may be supplied as a continuous wave.

The substrate processing apparatus 1 may further include a control unit 80. The control unit 80 may be a computer having a processor, a storage unit such as a memory, an input device, a display device, an input/output interface for signals, and the like. The control unit 80 controls each unit of the substrate processing apparatus 1. The control unit 80 may use an input device to input commands and the like so that the operator manages the substrate processing apparatus 1. In addition, the control unit 80 may visualize and display the operation status of the substrate processing apparatus 1 by the display device. In addition, a control program and recipe data are stored in a storage unit. The control program is executed by the processor in order to execute various processes in the substrate processing apparatus 1. The processor executes the control program and controls each unit of the substrate processing apparatus 1 according to the recipe data. In one exemplary embodiment, a part or all of the control unit 80 may be provided as part of a configuration of an apparatus external to the substrate processing apparatus 1.

Example of Substrate W

Figure 4:
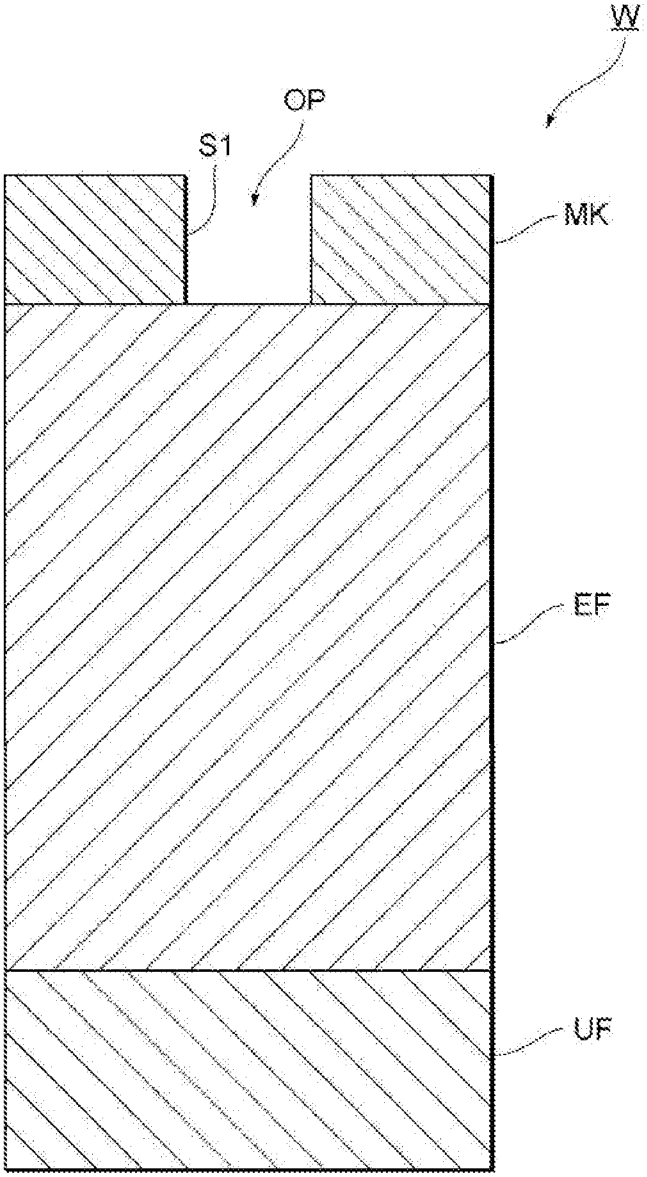
FIG. 4 is a diagram illustrating an example of a cross-sectional structure of a substrate W.

FIG. 4 is a diagram illustrating an example of a cross-sectional structure of the substrate W. The substrate W is an example of a substrate processed by the substrate processing apparatus 1. The substrate W may be formed by laminating, for example, a base film UF, an etching target film EF, and a mask film MK in this order.

The base film UF may be, for example, a silicon wafer or an organic film, a dielectric film, a metal film, a semiconductor film, and the like which are formed on the silicon wafer. The base film UF may be constituted by laminating a plurality of films.

The etching target film EF may be, for example, a silicon-containing film such as a silicon oxide film, a silicon nitride film, a silicon oxynitride film (SiON film), and a Si-ARC film. The silicon-containing film may include a polycrystalline silicon film. The etching target film EF may be constituted by laminating a plurality of films. For example, the etching target film EF may be a laminated film in which at least two types selected from the group consisting of a silicon oxide film, a polycrystalline silicon film, and a silicon nitride film are laminated. In one example, the etching target film EF may be constituted by alternately laminating a silicon oxide film and a polycrystalline silicon film. In addition, in one example, the etching target film EF may be constituted by alternately laminating a silicon oxide film and a silicon nitride film.

The base film UF and/or the etching target film EF to be etched may be formed by a CVD method, a spin coating method, or the like. The base film UF and/or the etching target film EF may be a flat film or may be a film having irregularities.

The mask film MK is formed on the etching target film EF. The mask film MK defines at least one opening OP on the etching target film EF. The opening OP is a space on the etching target film EF and is surrounded by a sidewall S1 of the mask film MK. That is, in FIG. 4, the etching target film EF has a region covered by the mask film MK and an exposed region at the bottom of the opening OP.

The opening OP may have any shape when the substrate W is viewed from the top (when the substrate W is viewed downwardly from the top in FIG. 4). The shape may be, for example, a hole shape, a linear shape, or a combination of the hole shape and the linear shape. The mask film MK may have a plurality of sidewalls S1, and the plurality of sidewalls S1 may define a plurality of openings OP. The plurality of openings OP may each have a linear shape and may be arranged in a line at regular intervals to form a line & space pattern. In addition, each of the plurality of openings OP may have a hole shape, and may constitute an array pattern.

The mask film MK is, for example, an organic film or a metal-containing film. The organic film may be, for example, a spin-on carbon film (SOC), an amorphous carbon film, or a photoresist film. The metal-containing film may include, for example, tungsten, tungsten carbide, tungsten silicide, or titanium nitride. The mask film MK may be formed by a CVD method, a spin coating method, or the like. The opening OP may be formed by etching the mask film MK. The mask film MK may be formed by lithography.

Example of Substrate Processing Method

Figure 5:
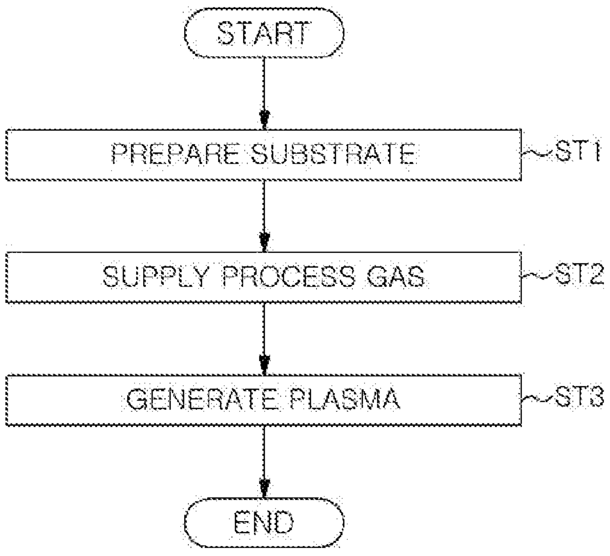
FIG. 5 is a flowchart illustrating an example of a substrate processing method in the substrate processing apparatus 1.

FIG. 5 is a flowchart showing an example of a substrate processing method (hereinafter, referred to as "the present processing method") in the substrate processing apparatus 1. This processing method is an example in which plasma is generated by supplying the process gas into the chamber in which the substrate W is disposed in order to etch the etching target film EF of the substrate W. This processing method includes a process of preparing a substrate (step ST1), a process of supplying a process gas (step ST2), and a process of generating plasma (step ST3). Hereinafter, a case in which the control unit 80 illustrated in FIG. 3 controls each unit of the substrate processing apparatus 1 to execute the present processing method on the substrate W illustrated in FIG. 4 will be described as an example.

(Step ST1: Preparation of Substrate)

In step ST1, the substrate W is prepared in the internal space 10*s* of the chamber 10. In the internal space 10*s*, the substrate W is disposed on the upper surface of the substrate support 14 and held by the electrostatic chuck 20. At least a part of the process of forming each configuration of the substrate W may be performed within the internal space 10*s*. Further, after all or part of each component of the substrate W is formed in an apparatus or chamber external to the substrate processing apparatus 1, the substrate W may be loaded into the internal space 10*s* and disposed on the upper surface of the substrate support 14.

(Step ST2: Supply of Process Gas)

In step ST2, a process gas is supplied into the internal space 10*s* from the gas supply unit. The process gas may contain a fluorine-containing gas. The fluorine-containing gas may be a gas such as $F_2$, $CF_4$, $SF_6$, $NF_3$, $XeF_2$, $WF_6$, $SiF_4$, $TaF_5$, $IF_7$, HF, $ClF_3$, $ClF_5$, $BrF_5$, $AsF_5$, $NF_6$, $PF_5$, $NbF_5$, $BiF_6$, and $UF_5$, and the like and may be gases such as $F_2$, $XeF_2$, $WF_6$, $MoF_6$, $IF_7$, HF, and $ClF_3$ and the like. Further, the fluorine-containing gas may be a gas capable of generating hydrogen fluoride (HF) species in the chamber 10 during the plasma processing. The HF species contains at least any one of a gas, a radical, and an ion of hydrogen fluoride. In one example, the fluorine-containing gas may be HF gas or hydrofluorocarbon gas. In addition, the fluorine-containing gas may be a mixed gas containing a hydrogen source and a fluorine source. The hydrogen source may be, for example, $H_2$, $NH_3$, $H_2O$, $H_2O_2$ or hydrocarbon ($CH_4$, $C_3H_6$, etc.). The fluorine source may be $NF_3$, $SF_6$, $WF_6$, $XeF_2$, fluorocarbon or hydrofluorocarbon. Hereinafter, these fluorine-containing gases are also referred to as "HF-based gases." Plasma generated from a process gas containing an HF-based gas contains a large amount of HF species (etchant). The HF-based gas may be a main etchant gas. The HF-based gas may have the largest flow rate ratio in the total flow rate of the reactive gas in the process gas, and may be, for example, 50 vol % or more, 60 vol % or more, 70 vol % or more, 80 vol % or more, and 90 vol % or more with respect to the total flow rate of the reactive gas. Further, the HF-based gas may be 96 vol % or less with respect to the total flow rate of the reactive gas. In the present embodiment, the reactive gas does not contain a noble gas such as Ar. In another example, the process gas may contain a noble gas in addition to the reactive gas.

The pressure of the process gas supplied into the internal space 10*s* is adjusted by controlling the pressure regulating valve of the exhaust device 50 connected to the chamber body 12. The pressure of the process gas may be, for example, 5 mTorr (0.7 Pa) or more and 100 mTorr (13.3 Pa) or less, 10 mTorr (1.3 Pa) or more and 60 mTorr (8.0 Pa) or less, or 20 mTorr (2.7 Pa) or more and 40 mTorr (5.3 Pa) or less.

(Step ST3: Plasma Generation)

Next, in step ST3, the high frequency power and/or the electric bias are supplied from the plasma generating unit (the high frequency power supply 62 and/or the bias power supply 64). As a result, the high-frequency electric field is generated between the upper electrode 30 and the substrate support 14, and the plasma is generated from the process gas in the internal space 10*s*. Active species such as ions and radicals in the generated plasma are attracted to the substrate W, and thus, the etching target film EF of the substrate W is etched.

In addition, during the plasma generation, the temperature of a lower surface (third surface) 361 of the support body 36 (see FIG. 6) may be controlled to 220° C. or lower, 200° C. or lower, 180° C. or lower, or 160° C. or lower. Thereby, it is possible to more effectively suppress the corrosion of the lower surface (third surface) 361 of the support body 36 by the fluorine-containing gas. The temperature of the lower surface (third surface) 361 of the support body 36 may be controlled, for example, by supplying a heat exchange medium (for example, refrigerant) to the flow path provided in the support body 36.

<Flow of Process Gas in Upper Electrode>

Figure 6:
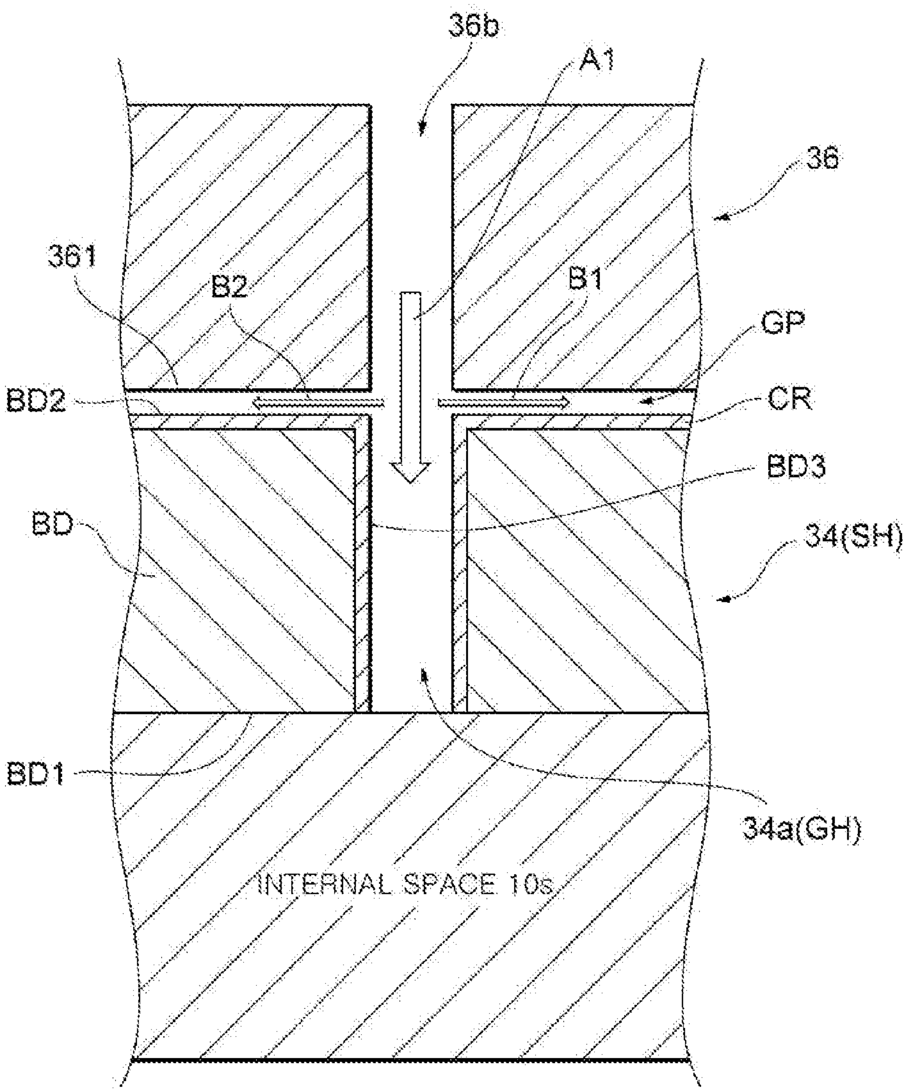
FIG. 6 is a diagram for describing a flow of a process gas in an upper electrode.

FIG. 6 is a view for describing a flow of process gas in the upper electrode 30. In step ST2, the process gas is supplied into the internal space 10*s* from the gas source group 40 and the gas supply pipe 38 through the upper electrode 30. In this case, in the upper electrode 30, the process gas flows from the gas supply path (gas inlet 36*c*, gas diffusion chamber 36*a*, and a plurality of gas holes 36*b*) of the support body 36 toward the gas discharge hole (gas hole GH) 34*a* of the upper plate 34 (shower head SH) (arrow A1 in FIG. 6).

As illustrated in FIG. 6, there may be a case where the gap GP is generated between the support body 36 and the upper plate 34 (shower head SH). In this case, a part of the process gas flowing from the gas hole 36*b* of the support body 36 toward the gas discharge hole 34*a* (gas hole GH) of the upper plate 34 (shower head SH) may flow toward the gap GP. (arrows B1 and B2 in FIG. 6).

That is, as illustrated in FIG. 6, the process gas flows into the gas discharge hole 34*a* (gas hole GH) of the upper plate 34 (shower head SH) and on the upper surface (second surface BD2) of the upper plate 34 (shower head SH). Here, the film CR is formed on the upper surface (second surface BD2) of the upper plate 34, and is made of the first corrosion-resistant material. Therefore, even when the process gas contains a corrosive gas (for example, a HF-based gas having high reactivity even before being converted to plasma), it is possible to suppress the corrosion of the upper surface of the upper plate 34. As illustrated in FIG. 6, when the film CR is also formed on the side surface (inner side surface BD3) defining the gas discharge hole 34*a* (gas hole GH), it is possible to suppress the corrosion of the side surface. As a result, it is possible to suppress the electrical conduction failure of the upper electrode 30 and the occurrence of particles (contamination of the internal space 10*s*) due to the corrosion of the upper plate 34 (shower head SH).

Meanwhile, the film made of the first corrosion-resistant material may not be formed on the lower surface (first surface BD1) of the upper plate 34 (shower head SH). The lower surface (first surface BD1) faces the internal space 10*s* and is exposed to plasma generated in the internal space 10*s*. Therefore, even if the lower surface (first surface BD1) is corroded by the process gas, the corroded portion may be relatively easily removed by being, for example, exposed to the plasma during cleaning of the chamber 10. On the other hand, the upper surface (second surface BD2) of the upper plate 34 is not a surface directly exposed to the plasma generated in the chamber, may not take such a removal means, have a large area that may be corroded, and may be easy to cause a problem of poor conduction and particles. Therefore, it is effective to constitute the upper surface (second surface BD2) of the upper plate 34 is made of the first corrosion-resistant material, and suppress the surface corrosion itself. In addition, even if a part (the vicinity of the internal space 10*s*) of the side surface (inner side surface BD3) defining the gas discharge hole 34*a* (gas hole GH) may be exposed to the plasma, since the removal means may not be taken for all of the side surfaces, it is effective to constitute the side surfaces with the first corrosion-resistant material and suppress the corrosion itself. In addition, when the body BD itself is formed of the first corrosion-resistant material, or when the body BD is formed of a base material containing carbon and a silicon carbide film covering the surface of the base material, the first surface BD1 and the inner side surface BD3 are made of the first corrosion-resistant material.

Each embodiment of the present disclosure can be variously modified without departing from the scope and spirit of the present disclosure. For example, the lower surface (third surface) 361 (surface defining the gap GP) of the support body 36 or the inner peripheral surface of the gas supply path (gas inlet 36*c*, gas diffusion chamber 36*a*, a plurality of gas holes 36*b*) illustrated in FIG. 6, and the inner peripheral surface of the gas supply pipe 38 illustrated in FIG. 3 may be both corroded by the process gas, but are not a part that is exposed to the plasma generated in the chamber, and are a part where the corrosion by plasma is hardly removed. Therefore, at least a part of these surfaces or the inner peripheral surfaces may be made of the corrosion-resistant material to suppress the corrosion itself. In this case, the corrosion-resistant material may be the same as or different from the first corrosion-resistant material. For example, the film of the second corrosion-resistant material may be formed on the lower surface (third surface) 361 of the support body 36, or the support body 36 itself may be made of the second corrosion-resistant material. The second corrosion-resistant material may be a semi-sealing-treated anodized film. In one example, the anodized film may be an aluminum oxide film formed by anodizing and semi-sealing treating the lower surface (third surface) 361 of the support body 36 made of aluminum. The conditions of the semi-sealing treatment are not particularly limited, and may be a chemical sealing treatment using water vapor or boiling water, or an electrochemical sealing treatment performed by an electrolytic treatment using an organic material or an inorganic material. In addition, the semi-sealing treatment is a process of incompletely sealing a bore (vacancy) which occurs on the treated surface after the anodizing. In the semi-sealing treatment, even if the oxide on the treated surface expands, it is possible to secure a location for the expanded oxide to go. For this reason, even when the support body 36 thermally expands by heat input from plasma, it is possible to suppress cracks from occurring in the support body 36. The porosity of the lower surface (third surface) 361 of the support body 36 after the semi-sealing treatment may be 5% or more, 10% or more, and 15% or more. When the porosity is less than 10%, cracks are likely to occur in the support body 36 due to the heat input from the plasma during the plasma processing. In addition, the porosity of the lower surface (third surface) 361 of the support body 36 may be 50% or less, 40% or less, and 30% or less. When the porosity exceeds 50%, the physical strength of the lower surface (third surface) 361 of the support 36 may decrease. Further, the porosity may be obtained by dividing an opening area of voids by a surface area of the lower surface (third surface) 361 of the support 36 when the cross section of the support body 36 is observed using a scanning electron microscope.

Also, for example, the film of the third corrosion-resistant material may be formed on the gas supply path of the support body 36 and/or the inner peripheral surface of the gas supply pipe 38, and the gas supply path of the support body 36 and/or the gas supply pipe 38 itself may be made of a third corrosion-resistant material. In this case, the third corrosion-resistant material may be the same as or different from the first corrosion-resistant material or the second corrosion-resistance material.

Also, for example, the substrate processing apparatus 1 may include the gas supply unit GU, which will be described later, in addition to the shower head SH. In addition, the gas supply unit GU is applicable to other substrate processing apparatuses using an arbitrary plasma source, such as an inductively coupled plasma or microwave plasma, in addition to the above-described capacitively coupled type substrate processing apparatus 1.

Figure 7A:
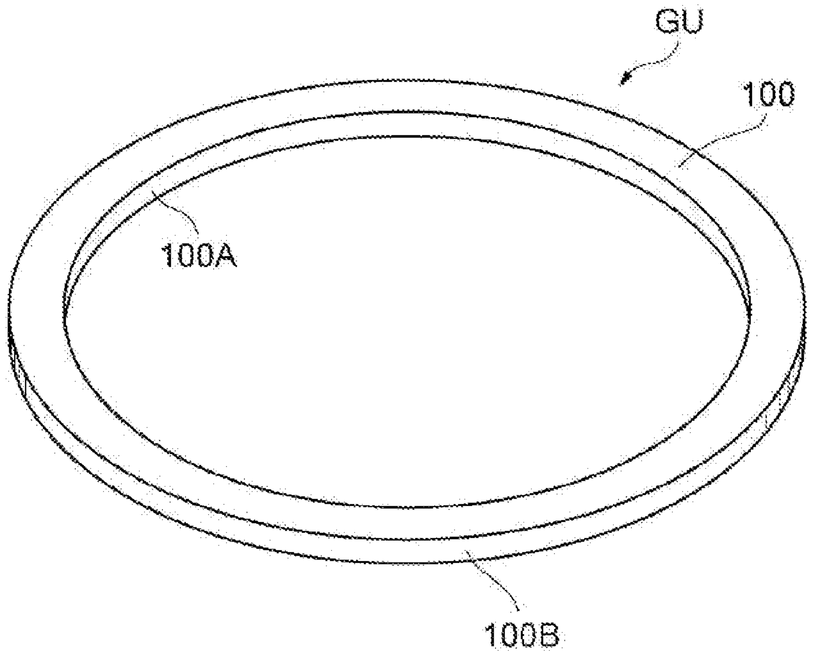
FIG. 7A is a perspective view of a gas supply unit GU.
Figure 7B:
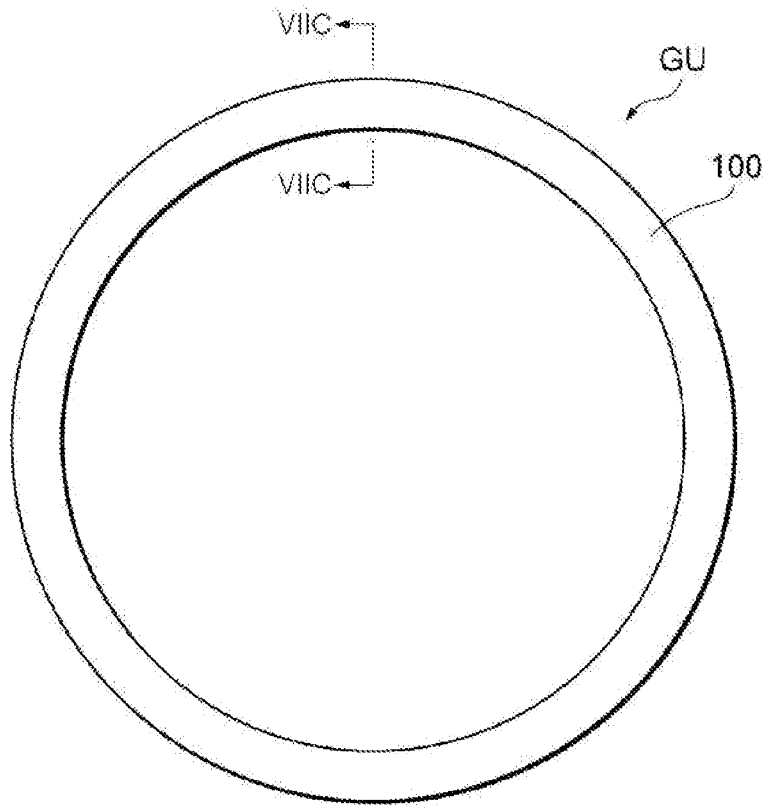
FIG. 7B is a plan view of the gas supply unit GU.
Figure 7C:
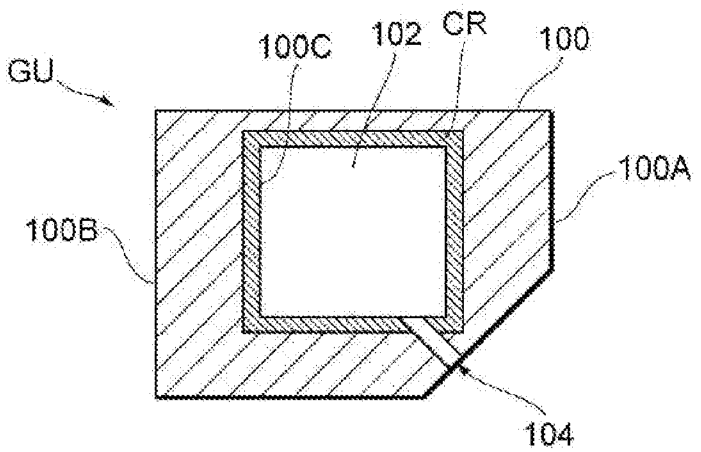
FIG. 7C is a cross-sectional view taken along line VIIC-VIIC of the gas supply unit GU of FIG. 7B.

FIG. 7A is a perspective view illustrating the gas supply unit GU according to one exemplary embodiment. FIG. 7B is a plan view of the gas supply unit GU. FIG. 7C is a cross-sectional view taken along line VIIC-VIIC of the gas supply unit GU of FIG. 7B. The gas supply unit GU is an example of a gas supply means for supplying gas into the chamber. The gas supply unit GU can be installed in the chamber along the inner wall of the chamber. A plurality of gas supply units GU may be provided in the chamber.

As illustrated in FIGS. 7A and 7B, the gas supply unit GU has an annular body part 100. The body part 100 may be made of, for example, a silicon-containing material. The silicon-containing material may be, for example, a conductive material such as silicon or silicon carbide, or an insulating material such as silicon oxide (for example, quartz). The body part 100 has a radially inner side surface 100A and a radially outer side surface 100B, and when the side surface 100B side is installed on the inner wall of the chamber, the side surface 100A side is configured to face a processing space in the chamber.

As illustrated in FIG. 7C, the body part 100 is a hollow body, and the gas supply path 102 is provided to go around an inside of the body part 100 in a circumferential direction. The gas supply path 102 communicates with a small-diameter gas hole 104. The gas hole 104 is opened toward the side surface 100A of the body part 100 on the radially inner side. A plurality of gas holes 104 are provided at predetermined intervals along the circumferential direction of the body part 100.

The gas supply path 102 has at least one gas inlet (not illustrated). The process gas supplied to the chamber from an external gas source group through a gas supply pipe is introduced into the gas inlet. The process gas flowing into the gas supply path 102 through the gas inlet flows into the gas supply path 102 along the circumferential direction, and is discharged from any one of the plurality of gas holes 104. In the example illustrated in FIG. 7C, since the lower portion of the side surface 100A provided with the gas hole 104 has an inclination, the process gas discharged from the gas hole 104 is discharged obliquely downward.

An inner peripheral surface 100C of the body part 100 is made of the first corrosion-resistant material. As illustrated in FIG. 7C, the film CR which is made of the first corrosion-resistant material described above is formed on the inner peripheral surface 100C of the body part 100. In one example, instead of or in addition to forming the film CR, the body part 100 itself may be made of the first corrosion-resistant material. The inner peripheral surface 100C of the body part 100 may be corroded by the process gas, but is not a part exposed to plasma generated in the chamber, and is a difficult part to remove corrosion by plasma. Therefore, it is effective to constitute the inner peripheral surface 100C of the body part 100 with the first corrosion-resistant material, and suppress the surface corrosion itself. Moreover, the gas hole 104 may be made of the first corrosion-resistant material.

Embodiments of the present disclosure further include the following aspects.

(Supplementary Note 1)

A shower head for plasma processing, including:

a body part having a first surface, a second surface opposite to the first surface, and a plurality of inner side surfaces, the plurality of inner side surfaces configured to define a plurality of gas holes penetrating through the body part from the first surface to the second surface, wherein the second surface is made of a first corrosion-resistant material.

(Supplementary Note 2)

The shower head according to Supplementary Note 1, wherein the first corrosion-resistant material is a material having a higher corrosion resistance to gas including at least one selected from a group consisting of $F_2$, $XeF_2$, $WF_6$, $MoF_6$, $IF_7$, HF, and $ClF_3$ than a material constituting the body part.

(Supplementary Note 3)

The shower head according to Supplementary Note 1, wherein the first corrosion-resistant material is a material having a higher corrosion resistance to hydrogen fluoride gas than a material constituting the body part.

(Supplementary Note 4)

The shower head according to any one of Supplementary Notes 1 to 3, wherein a film made of the first corrosion-resistant material is formed on the second surface.

(Supplementary Note 5)

The shower head according to Supplementary Note 4, wherein the film is further provided on the plurality of inner side surfaces.

(Supplementary Note 6)

The shower head according to Supplementary Note 4 or 5, wherein the film is not formed on the first surface.

(Supplementary Note 7)

The shower head according to Supplementary Note 1, wherein the body part is made of the first corrosion-resistant material.

(Supplementary Note 8)

The shower head according to any one of Supplementary Notes 1 to 7, wherein the first corrosion-resistant material is a carbon-containing material or a metal-containing material.

(Supplementary Note 9)

The shower head according to Supplementary Note 8, wherein the first corrosion-resistant material includes at least one selected from a group consisting of a fluorocarbon resin, carbon, fluorinated carbon, a polyimide resin, and silicon carbide.

(Supplementary Note 10)

The shower head according to Supplementary Note 8, wherein the first corrosion-resistant material includes at least one selected from a group consisting of metal, metal nitride, metal carbide, metal oxide, and an alloy.

(Supplementary Note 11)

The shower head according to any one of Supplementary Notes 1 to 10, wherein the body part is made of a silicon-containing material.

(Supplementary Note 12)

The shower head according to Supplementary Note 11, wherein the silicon-containing material is a conductive silicon-containing material.

(Supplementary Note 13)

The shower head according to Supplementary Note 11, wherein the silicon-containing material is silicon oxide.

(Supplementary Note 14)

The shower head according to Supplementary Note 11, wherein the body part includes a base material containing carbon and a silicon carbide film configured to cover a surface of the base material.

(Supplementary Note 15)

The shower head according to any one of Supplementary Notes 1 to 14, wherein the body part has a substantially disk shape, the first surface constitutes one surface of the disk, and the second surface constitutes the other surface of the disk.

(Supplementary Note 16)

An electrode unit, including:

the shower head according to any one of Supplementary Notes 1 to 15, and a conductive support body disposed on a second surface side of the shower head and having a gas supply path for supplying a process gas to the plurality of gas holes of the shower head.

(Supplementary Note 17)

The electrode unit according to Supplementary Note 16, wherein a third surface of the support body opposite to the second surface of the shower head is made of a second corrosion-resistant material.

(Supplementary Note 18)

The electrode unit according to Supplementary Note 17, wherein the second corrosion-resistant material is a semi-sealing-treated anodized film.

(Supplementary Note 19)

A gas supply unit for plasma processing, including:

an annular body part, a plurality of gas holes provided on a radially inner side of the body part and provided along a circumferential direction of the body part, and a gas supply path provided inside of the body part and communicating with the plurality of gas holes, wherein at least an inner peripheral surface of the gas supply path is made of a first corrosion-resistant material.

(Supplementary Note 20)

A substrate processing apparatus including:

a chamber for plasma processing, a substrate support provided in the chamber, the electrode unit according to Supplementary Note 16 or 17, which is disposed on an upper portion of the chamber so that the first surface of the shower head faces the substrate support, a plasma generation unit, and a control unit.

(Supplementary Note 21)

A substrate processing apparatus including:

a chamber for plasma processing, a substrate support provided in the chamber, the gas supply unit according to Supplementary Note 19 installed along an inner wall of the chamber, a plasma generation unit, and a control unit.

(Supplementary Note 22)

The substrate processing apparatus of Supplementary Note 20 or 21, wherein the chamber is connected to a gas source group for supplying a process gas containing a hydrogen fluoride gas, and the controller is configured to execute:

a process of controlling a temperature of a third surface of the support body to 220° C. or less, the third surface of the support body opposite to the second surface of the shower head, a process of disposing a substrate having a silicon-containing film on the substrate support, a process of supplying the process gas from the gas source group into the chamber, and a process of generating plasma from the process gas by the plasma generation unit and etching the silicon-containing film.

(Supplementary Note 23)

A substrate processing system, including:

the substrate processing apparatus according to Supplementary Note 20 or 21, a gas source group, and a gas supply pipe for supplying a process gas from the gas source group to the substrate processing apparatus, wherein at least an inner peripheral surface of the gas supply pipe is made of a corrosion-resistant material.

(Supplementary Note 24)

A support body for supporting a shower head of a plasma processing apparatus, in which the support body has a gas supply path for supplying process gas to the shower head, and a support surface for supporting the shower head is made of a second corrosion-resistant material.

(Supplementary Note 25)

The support body according to Supplementary Note 24, wherein the second corrosion-resistant material is a semi-sealing-treated anodized film.

The invention claimed is:

1. A shower head for plasma processing, comprising:

a body part comprised of silicon carbide, the body part including:

a first surface configured to be exposed to an internal space of a plasma processing chamber and including a plurality of first holes;

a second surface opposite to the first surface and including a plurality of second holes, the second surface being disposed in a gap defined by the body part and a support body of an upper electrode;

a plurality of inner side surfaces; and a natural oxide film disposed on the second surface and the plurality of inner side surfaces, the natural oxide film being made of a first corrosion-resistant material, wherein the plurality of inner side surfaces define a plurality of gas holes penetrating through the body part from the first surface to the second surface, the natural oxide film is formed from the silicon carbide of the body part, the first corrosion-resistant material has a higher corrosion resistance to gas including at least one selected from a group consisting of $F_2$, $XeF_2$, $WF_6$, $MoF_6$, $IF_7$, HF, and $ClF_3$ than the first surface of the body part, a diameter of the plurality of first holes is substantially equal to a diameter of the plurality of second holes, the shower head is configured to flow a processing gas toward the plurality of gas holes and into the gap defined by the body part and the support body of the upper electrode, and the natural oxide film is not formed on the first surface.

2. The shower head according to claim 1, wherein the first corrosion-resistant material has a higher corrosion resistance to hydrogen fluoride gas than the body part.

3. The shower head according to claim 1, wherein the body part has a substantially disk shape, the first surface constitutes one surface of the disk, and the second surface constitutes the other surface of the disk.

4. A gas supply for plasma processing, comprising:

an annular body part comprised of silicon carbide, the annular body part including:

a first surface configured to be exposed to an internal space of a plasma processing chamber and including a plurality of first holes;

a second surface opposite to the first surface and including a plurality of second holes, the second surface being disposed in a gap defined by the annular body part and a support body of an upper electrode;

a plurality of inner side surfaces; and a natural oxide film disposed on the second surface and the plurality of inner side surfaces, the natural oxide film being made of a first corrosion-resistant material, wherein the plurality of inner side surfaces define a plurality of gas holes penetrating through the body part from the first surface to the second surface; and a gas supply path disposed inside of the annular body part and communicating with the plurality of gas holes, wherein the natural oxide film is formed from the silicon carbide of the annular body part, the first corrosion-resistant material has a higher corrosion resistance to gas including at least one selected from a group consisting of $F_2$, $XeF_2$, $WF_6$, $MoF_6$, $IF_7$, HF, and $ClF_3$ than the first surface of the annular body part, a diameter of the plurality of first holes is substantially equal to a diameter of the plurality of second holes, the annular body part is configured to flow a processing gas toward the plurality of gas holes and into the gap defined by the annular body part and the support body of the upper electrode, and the natural oxide film is not formed on the first surface.

5. A substrate processing apparatus, comprising:

a chamber for plasma processing;

a substrate support disposed in the chamber;

the gas supply according to claim 4 installed along an inner wall of the chamber;

a power supply; and a controller having a processor and a memory with a computer readable program stored therein.

* * * * *